(12) United States Patent
Qiao et al.

(10) Patent No.: US 11,211,486 B2
(45) Date of Patent: Dec. 28, 2021

(54) POWER MOS DEVICE WITH LOW GATE CHARGE AND A METHOD FOR MANUFACTURING THE SAME

(71) Applicant: University of Electronic Science and Technology of China, Chengdu (CN)

(72) Inventors: Ming Qiao, Chengdu (CN); Zhengkang Wang, Chengdu (CN); Shida Dong, Chengdu (CN); Bo Zhang, Chengdu (CN)

(73) Assignee: UNIVERSITY OF ELECTRONIC SCIENCE AND TECHNOLOGY OF CHINA, Chengdu (CN)

( * ) Notice: Subject to any disclaimer, the term of this patent is extended or adjusted under 35 U.S.C. 154(b) by 0 days.

(21) Appl. No.: 17/005,354

(22) Filed: Aug. 28, 2020

(65) Prior Publication Data

US 2021/0336052 A1    Oct. 28, 2021

(30) Foreign Application Priority Data

Apr. 28, 2020 (CN) .......................... 202010352084.0

(51) Int. Cl.
| | |
|---|---|
| *H01L 29/78* | (2006.01) |
| *H01L 21/82* | (2006.01) |
| *H01L 29/423* | (2006.01) |
| *H01L 29/66* | (2006.01) |
| *H01L 21/8234* | (2006.01) |

(52) U.S. Cl.
CPC .. *H01L 29/7813* (2013.01); *H01L 21/823437* (2013.01); *H01L 29/4236* (2013.01); *H01L 29/66734* (2013.01)

(58) Field of Classification Search
CPC ... H01L 29/42; H01L 29/423; H01L 29/4236; H01L 29/66; H01L 29/667; H01L 29/6673; H01L 29/66734; H01L 29/78; H01L 29/781; H01L 29/7813; H01L 21/82; H01L 21/823; H01L 21/8234; H01L 21/82343; H01L 21/82347
USPC ........................................................... 257/330
See application file for complete search history.

(56) References Cited

U.S. PATENT DOCUMENTS

| | | | |
|---|---|---|---|
| 5,998,833 A | 12/1999 | Baliga | |
| 10,720,524 B1* | 7/2020 | Qiao | ................ H01L 29/7811 |
| 2013/0043519 A1* | 2/2013 | Moon | ............... H01L 29/42368 |
| | | | 257/296 |

* cited by examiner

*Primary Examiner* — Monica D Harrison
(74) *Attorney, Agent, or Firm* — Bayramoglu Law Offices LLC (57) ABSTRACT

A power MOS device with low gate charge and a method for manufacturing the same. The device includes an M-shaped gate structure, which reduces the overlapped area between control gate electrode and split gate electrode. A low-k material is introduced to reduce dielectric constant of the isolation medium material. The combination of the M-shaped gate structure and low-k material can reduce parasitic capacitance Cgs of the device, thereby increasing switching speed and reducing switching losses.

5 Claims, 9 Drawing Sheets

POWER MOS DEVICE WITH LOW GATE CHARGE AND A METHOD FOR MANUFACTURING THE SAME

CROSS-REFERENCE TO RELATED APPLICATIONS

This application is based upon and claims priority to Chinese Patent Application No. 202010352084.0, filed on Apr. 28, 2020, the entire contents of which are incorporate herein by reference.

TECHNICAL FIELD

The invention relates to the field of semiconductor technologies, and specifically relates to a power MOS device with low gate charge and a method for manufacturing the same.

BACKGROUND

In a power management system, a power semiconductor device is required to have a low on-resistance and parasitic capacitance to reduce conduction losses and switching losses of the device.

Power VDMOS is widely used in power management systems for its low gate drive power consumption, fast switching speed and easy parallel connection. B. J. Baliga proposed a MOSFET device structure having a split gate deep trench in U.S. Pat. No. 5,998,833. This structure uses a split gate electrode to shield charge coupling between control gate electrode and epitaxial layer to reduce parasitic gate-to-drain capacitance Cgd. This split gate power MOS device structure not only reduces the Cgd introduced by the overlap of gate field plate and epitaxial layer in RESURF stepped oxide (RSO) MOS device, but also retains the assistant depletion effect of the gate field plate to the epitaxial layer. Therefore, the split gate deep trench MOS device has a lower gate charge Qg, while the on-resistance Ron is not degraded. This is beneficial to the improvement of switching characteristics and operation efficiency of the power management system. However, the split gate electrode connected to source in the split gate deep trench MOS device reduces the Cgd of the device, while introduces additional parasitic capacitance Cgs between the gate and split gate electrode, and parasitic capacitance Cds between the split gate electrode and drain, which increases the input capacitance Ciss (Ciss=Cgs+Cgd) and output capacitance Coss (Coss=Cds+Cgd) of the split gate deep trench MOS device. Thus, it offsets the advantage in reducing Cgd of the split gate deep trench MOS device.

Therefore, in order to partially solve the above problems, it is necessary to reduce the parasitic capacitance Cgs caused by the split gate electrode in the conventional split gate power MOS device. The embodiments of the present invention appear under this background.

SUMMARY

The present invention provides a power MOS device with low gate charge and a method for manufacturing the same. The device includes an M-shaped gate structure, which reduces the overlapped area between control gate electrode and split gate electrode, and a low-k material, which is introduced to reduce the dielectric constant of isolation medium. The combination of the M-shaped gate structure and low-k material greatly reduce the parasitic capacitance Cgs of the device, which facilitates improvement of switching speed of the device and reduction of switching loss. At the same time, N/P strips are introduced in the drift region of the device to reduce Ron. The use of stepped split gate electrode also enables more uniform distribution of electric field in the drift region of the device and improvement of breakdown voltage BV.

To achieve the purposes of the above objectives, the present invention provides the following technical solutions:

In one embodiment, a power MOS device with low gate charge, the device includes a substrate, an epitaxial layer is provided on the upper surface of the substrate, a control gate trench is provided in the epitaxial layer, a control gate electrode and a split gate electrode are in the control gate trench, the control gate electrode is located on the upper half portion of the control gate trench and above the split gate electrode, the control gate electrode is shaped as the letter 'M', and it includes two vertical sections located on its left side and right side, and one arc section connected between the two vertical sections, the vertical section is in contact with a gate dielectric, the control gate electrode and the split gate electrode are separated by a trench dielectric, and the control gate electrode is separated from a well region in the epitaxial layer by the gate dielectric; the split gate electrode is located on the lower half portion of the control gate trench, the split gate electrode is separated from the epitaxial layer by the trench dielectric, a well region electrode is contained inside the well region, the upper portion of the well region is a source region, the source region and the well region electrode are connected by a metal and then an electrode is led out.

In one embodiment, the control gate electrode and the split gate electrode are separated by a low dielectric constant material.

In one embodiment, the dielectric material of the lower half portion of the control gate trench is the low dielectric constant material.

In one embodiment, the dielectric constant of the low dielectric constant material is less than 3.9.

In one embodiment, N strips and P strips are alternately arranged in the drift region.

As a preferred embodiment, the split gate electrode of the device has a stepped shape.

A method for manufacturing the power MOS device with low gate charge includes the following steps:
1) forming a series of trenches in the epitaxial layer;
2) forming a dielectric layer inside the trench by thermal oxidation or deposition of silicon dioxide;
3) depositing polysilicon in the trench and etching back to form the split gate electrode;
4) isotropically etching the dielectric layer inside the trench;
5) depositing low dielectric constant material inside the trench and etching back;
6) growing gate dielectric on the inner sidewall of the trench;
7) depositing polysilicon on the surface of the device, so that the polysilicon inside the trench has a U shape;
8) performing anisotropic etching to only retain the control gate electrode on the inner sidewall of the trench;
9) depositing silicon dioxide and isotropically etching back, so that the gate dielectric is not completely etched;
10) depositing polysilicon and performing anisotropic etching to form the control gate electrode with an M shape;

11) using ion implantation to form the well region and source region, depositing the dielectric layer, etching the dielectric layer and source region, and applying another ion implantation to form the well region electrode and leading out an electrode.

Because the control gate electrode is made into an M shape, the dielectric layer between the control gate electrode and the split gate electrode becomes thicker and completely separates the control gate electrode and the split gate electrode, thereby increasing the coupling distance between the control gate electrode and split gate electrode, while reducing the coupling area between the control gate electrode and split gate electrode, and effectively reducing the gate-to-source capacitance Cgs. At the same time, the control gate electrode and split gate electrode are separated by the low-k material, which further reduces coupling capacitance between them, thereby effectively reducing the gate charge required to turn on the device. The M-shaped control gate electrode facilitates leading out of the electrode and can also alleviate the gate resistance degradation caused by the narrow gate. In addition, the low dielectric constant material can also be used as the material of the lower half portion of the trench so as to reduce the parasitic capacitance Cds of the device.

The elements according to the present invention are numbered in FIG. 1-6 as: 10—substrate, 11—epitaxial layer, 12—control gate trench, 13—trench dielectric, 14—split gate electrode, 15—control gate electrode, 16—well region, 17—well region electrode, 18—source region, 19—source metal, 100—gate dielectric, 131—low dielectric constant material.

DETAILED DESCRIPTION

Implementations of the invention are illustrated below by way of specific examples, and those skilled in the art can easily understand other advantages and effects of the invention from the content disclosed in this description. The invention can also be implemented or applied through other different specific embodiments, and various details in this description can also be modified or changed based on different viewpoints and applications without departing from the spirit of the invention.

Figure 2:
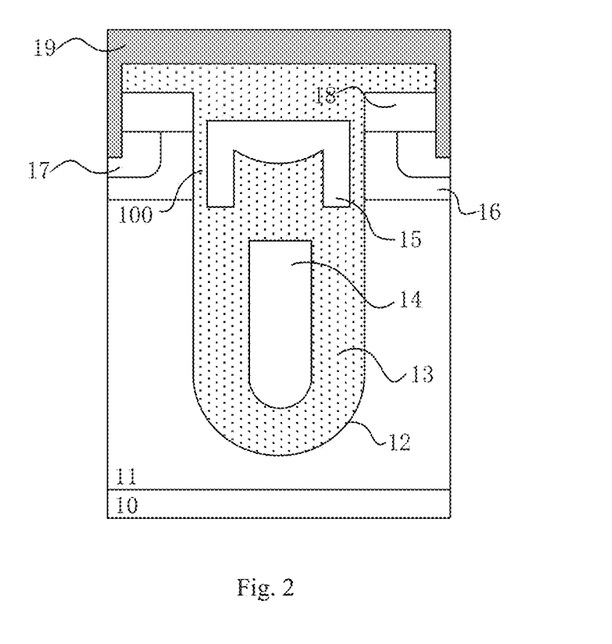
FIG. 2 shows a power MOS device with low gate charge according to the present invention.

As shown in FIG. 2, this embodiment provides a power MOS device with low gate charge, wherein the device includes a substrate 10, an epitaxial layer 11 is provided on the upper surface of the substrate 10, a control gate trench 12 is provided in the epitaxial layer 11, a control gate electrode 15 and a split gate electrode 14 are contained in the control gate trench 12, the control gate electrode 15 is located on the upper half portion of the control gate trench 12 and above the split gate electrode 14, the control gate electrode 15 has an M shape including two vertical sections respectively on left side and right side and one arc section connected between the two vertical sections, the vertical section 0.1 contacts with a gate dielectric 100, the control gate electrode 15 and the split gate electrode 14 are separated by a trench dielectric 13, and the control gate electrode 15 is separated from a well region 16 in the epitaxial layer 11 by the gate dielectric 100; the split gate electrode 14 is located on the lower half portion of the control gate trench 12, the split gate electrode 14 is separated from the epitaxial layer 11 by the trench dielectric 13, a well region electrode 17 is contained inside the well region 16, the upper portion of the well region 16 is a source region 18, the source region 18 and the well region electrode 17 are connected by a metal and then an electrode is led out.

Figure 3:
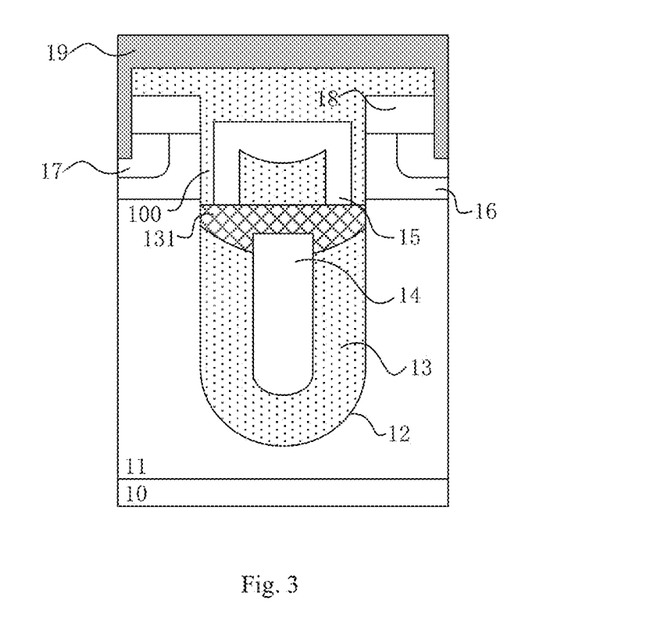
FIG. 3 shows a power MOS device with low gate charge according to the present invention.

As shown in FIG. 3, in another embodiment according to the present invention: the control gate electrode 15 and the split gate electrode 14 are separated by a low dielectric constant material 131, and the dielectric constant of the low dielectric constant material is less than 3.9.

A method for manufacturing the power MOS device with low gate charge includes the following steps:

1) forming a series of trenches in the epitaxial layer;
2) forming a dielectric layer inside the trench by thermal oxidation or deposition of silicon dioxide;
3) depositing polysilicon in the trench and etching back to form the split gate electrode;
4) isotropically etching the dielectric layer inside the trench;
5) depositing low dielectric constant material inside the trench and etching back;
6) growing gate dielectric on the inner sidewall of the trench;
7) depositing polysilicon on the surface of the device, so that the polysilicon inside the trench has a U shape;
8) performing anisotropic etching so as to only retain the control gate electrode on the inner sidewall of the trench;
9) depositing silicon dioxide and isotropically etching back, so that the gate dielectric is not completely etched;
10) depositing polysilicon and performing anisotropic etching to form the M-shaped control gate electrode;
11) using ion implantation to form the well region and source region, depositing the dielectric layer, etching the dielectric layer and source region, and applying another ion implantation to form the well region electrode and leading out an electrode.

Figure 1:
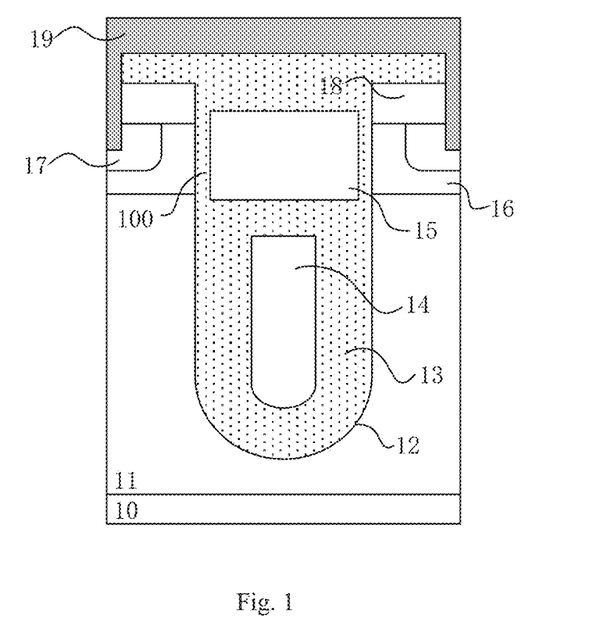
FIG. 1 shows a structure of conventional split gate device.
Figure 6:
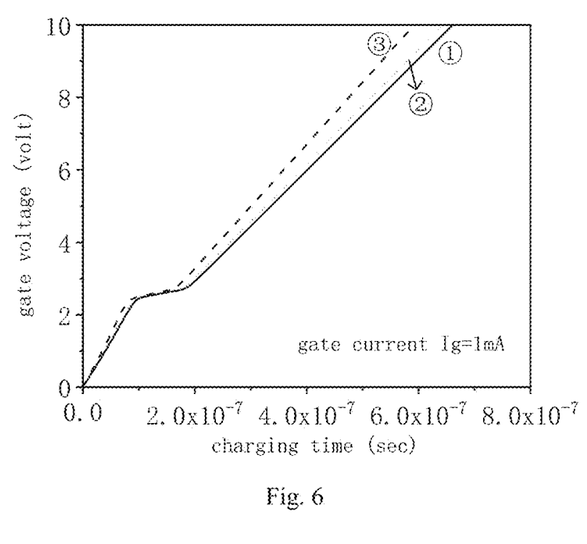
FIG. 6 compares the simulation results of gate charge characteristics of the structure according to the present invention and conventional device structure. Line ① is the gate charge curve of the conventional structure as shown in FIG. 1, line ② is the gate charge curve of the device structure of Embodiment 1 as shown in FIG. 2, and line ③ is the gate charge curve of the device structure of Embodiment 2 as shown in FIG. 3.

FIG. 6 shows simulation results of gate charge characteristics of the structure proposed by the invention and the conventional device structure. Line ① is the gate charge curve of the conventional structure as shown in FIG. 1, line ② is the gate charge curve of the device structure of Embodiment 1 as shown in FIG. 2, and line ③ is the gate charge curve of the device structure of Embodiment 2 as shown in FIG. 3. In the simulation, all of the three structures are the same in terms of size, doping concentration and other parameters. It can be seen from FIG. 6 that under the same condition, the proposed structure can effectively reduce gate charge.

Figure 4:
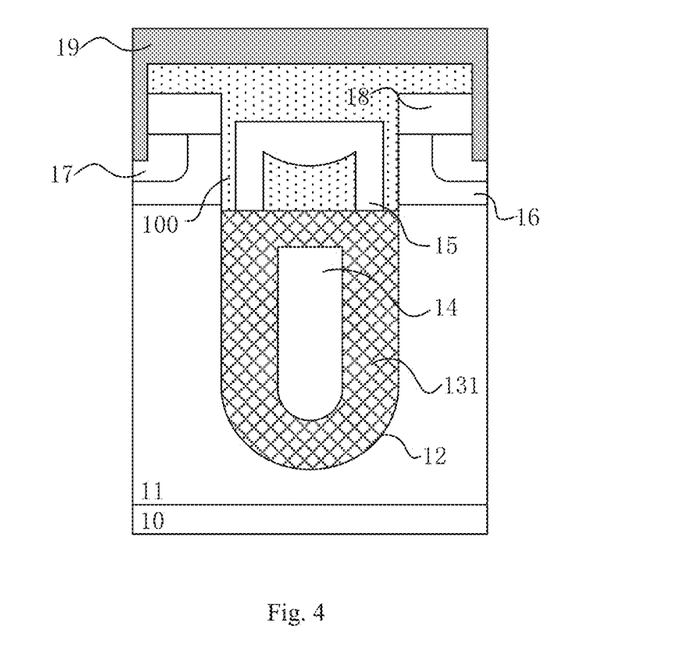
FIG. 4 shows a power MOS device with low gate charge according to the present invention.
Figure 5A:
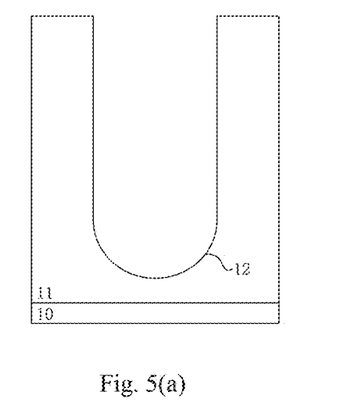
FIGS. 5(a)-5(o) show main process steps of the power MOS device with low gate charge of FIG. 3 according to the present invention.
Figure 5B:
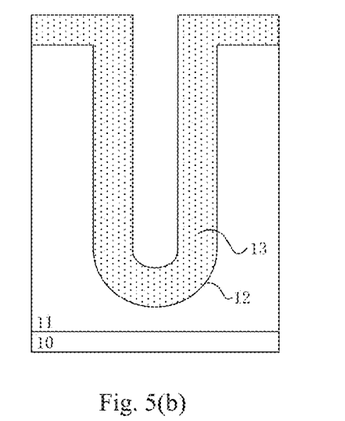
Figure 5C:
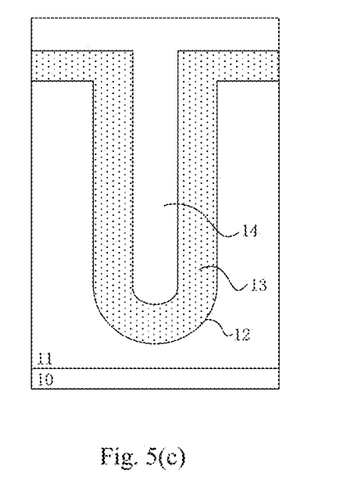
Figure 5D:
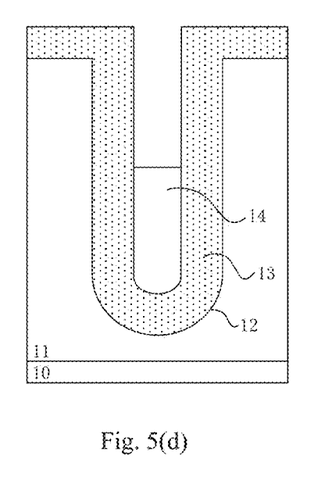
Figure 5E:
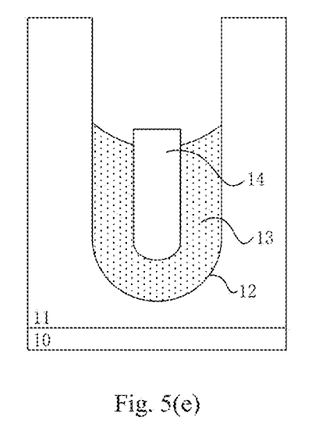
Figure 5F:
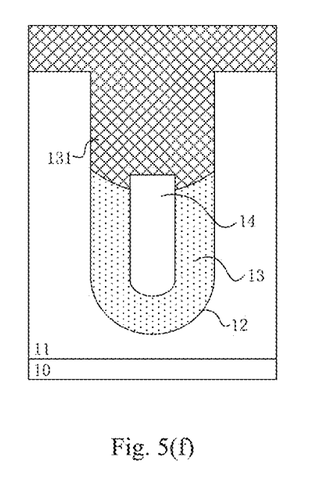
Figure 5G:
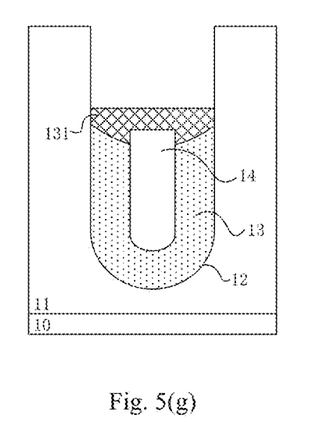
Figure 5H:
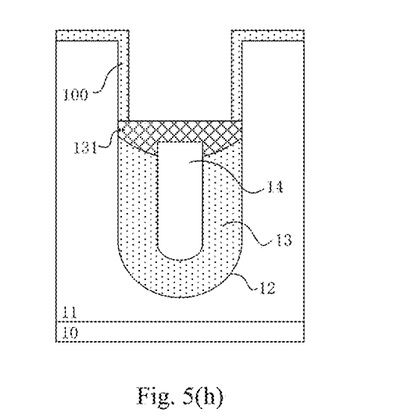
Figure 5I:
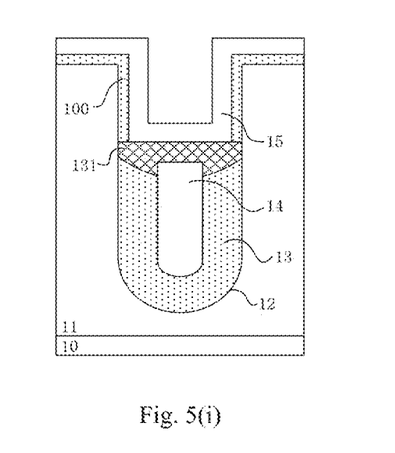
Figure 5J:
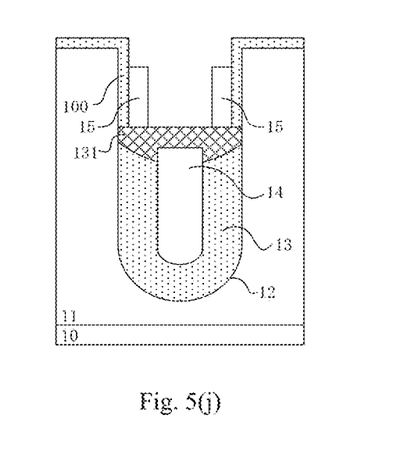
Figure 5K:
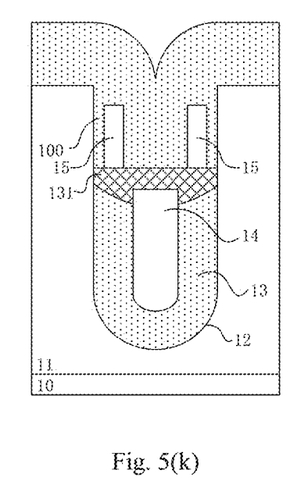
Figure 5L:
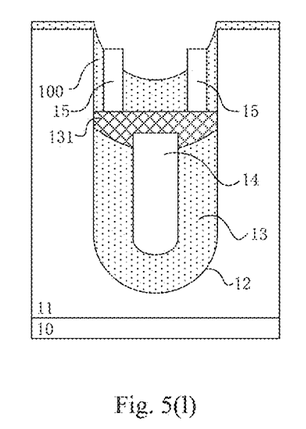
Figure 5M:
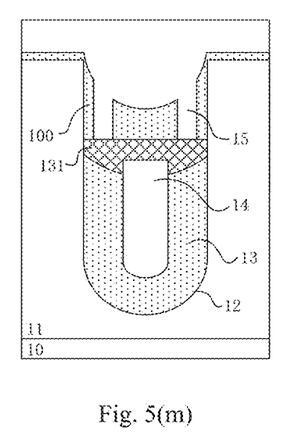
Figure 5N:
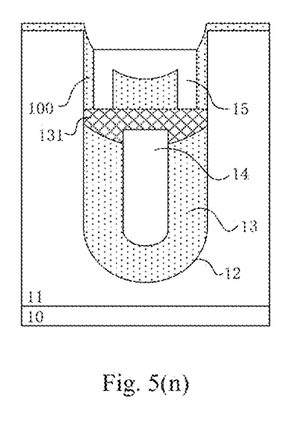
Figure 5O:
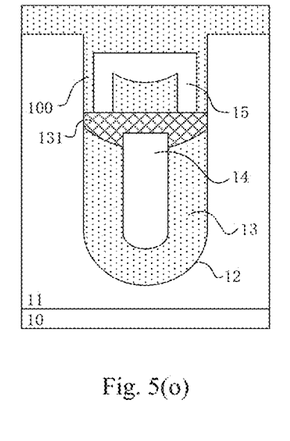

As shown in FIG. 4, yet another embodiment includes the dielectric material of the lower half portion of the control gate trench is low dielectric constant material 131. Accordingly, N strips and P strips are alternately arranged in the drift region of the device.

Yet in another embodiment, the split gate electrode 14 of the device has a stepped shape.

The above embodiments only exemplarily illustrate the principles and effects of the invention, and are not used to limit thereto. Anyone familiar with this technology can modify or change the above embodiments without departing from the spirit and scope of the invention. Therefore, all equivalent modifications or changes made by those with ordinary knowledge in the technical field without departing from the spirit and technical ideas disclosed in the invention should still be encompassed by the claims of the invention.

What is claimed is:

1. A method for manufacturing a control gate electrode and a split gate electrode of a power MOS device with low gate charge, the method comprising:
forming a series of trenches in an epitaxial layer;
forming a dielectric layer inside the trench by thermal oxidation or deposition of silicon dioxide;
depositing polysilicon in the trench and etching back to form the split gate electrode;
isotropically etching the dielectric layer inside the trench;
depositing a low dielectric constant material inside the trench and etching back;
growing a gate dielectric on an inner sidewall of the trench;
depositing polysilicon on a surface of the power MOS device, so that the polysilicon inside the trench has a U shape;
performing anisotropic etching so as to only retain the control gate electrode on the inner sidewall of the trench;
depositing silicon dioxide and isotropically etching back, so that the gate dielectric is not completely etched;
depositing polysilicon and performing anisotropic etching to form an M-shaped control gate electrode;
using ion implantation to form a well region and a source region, depositing the dielectric layer, etching the dielectric layer and the source region, and applying another ion implantation to form a well region electrode and leading out an electrode;
wherein the power MOS device comprises a substrate and the epitaxial layer, the epitaxial layer is provided on an upper surface of the substrate, wherein a control gate trench is provided in the epitaxial layer, wherein the control gate electrode and the split gate electrode are contained in the control gate trench; the control gate electrode is located on an upper half portion of the control gate trench and above the split gate electrode, the control gate electrode has the M shape comprising two vertical sections respectively on a first side and a second side and one arc section connected between the two vertical sections, the vertical section is in contact with the gate dielectric, the control gate electrode and the split gate electrode are separated by a trench dielectric, and the control gate electrode is separated from the well region in the epitaxial layer by the gate dielectric; the split gate electrode is located on a lower half portion of the control gate trench, the split gate electrode is separated from the epitaxial layer by the trench dielectric, the well region electrode is contained inside the well region, the upper portion of the well region is the source region, the source region and the well region electrode are connected by a metal and the electrode is led out; and the control gate electrode and the split gate electrode are separated by a low dielectric constant material.

2. The method for manufacturing the control gate electrode and the split gate electrode of the power MOS device with low gate charge according to claim 1, wherein the dielectric material of the lower half portion of the control gate trench is the low dielectric constant material.

3. The method for manufacturing the control gate electrode and the split gate electrode of the power MOS device with low gate charge according to claim 1, wherein the dielectric constant of the low dielectric constant material is less than 3.9.

4. The method for manufacturing the control gate electrode and the split gate electrode of the power MOS device with low gate charge according to claim 1, wherein N strips and P strips are alternately arranged in the drift region of device.

5. The method for manufacturing the control gate electrode and the split gate electrode of the power MOS device with low gate charge according to claim 1, wherein the split gate electrode of the device has a stepped shape.

* * * * *